United States Patent
Tung

(10) Patent No.: US 6,198,131 B1
(45) Date of Patent: Mar. 6, 2001

(54) HIGH-VOLTAGE METAL-OXIDE SEMICONDUCTOR

(75) Inventor: Ming-Tsung Tung, Hsinchu Hsien (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/206,451

(22) Filed: Dec. 7, 1998

(51) Int. Cl.$^7$ .................................................... H01L 29/76
(52) U.S. Cl. .................... 257/345; 257/335; 257/336; 257/338; 257/340; 257/344; 257/345; 257/346; 257/349
(58) Field of Search ............................ 257/345, 344, 257/346, 349, 336, 338, 340, 335

(56) References Cited

U.S. PATENT DOCUMENTS

| | | | |
|---|---|---|---|
| 5,021,845 | * 6/1991 | Hashimoto | 357/23.4 |
| 5,349,225 | * 9/1994 | Redwine et al. | 257/336 |
| 5,675,166 | * 10/1997 | Ilderem et al. | 257/345 |
| 5,691,560 | * 11/1997 | Sakakibara | 257/316 |
| 5,719,422 | * 2/1998 | Burr et al. | 257/336 |
| 5,923,065 | * 7/1999 | So et al. | 257/328 |
| 5,929,483 | * 7/1999 | Kim et al. | 257/336 |
| 5,939,751 | * 8/1999 | Jang | 257/328 |
| 6,040,603 | * 3/2000 | Yang | 257/344 |
| 6,046,472 | * 4/2000 | Ahmad et al. | 357/336 |
| 6,078,081 | * 6/2000 | Lee | 257/344 |
| 6,081,010 | * 6/2000 | Sanchez | 257/345 |

FOREIGN PATENT DOCUMENTS

405343433 * 12/1993 (JP) ............................... 257/345

* cited by examiner

Primary Examiner—Mahshid Saadat
Assistant Examiner—Edgardo Ortiz

(57) ABSTRACT

A high voltage metal oxide semiconductor device. The high voltage device comprises a high voltage NMOS, a high voltage PMOS, or a high voltage CMOS. A field oxide layer is used to isolate the gate from the source region, while a diffusion region is formed under the field oxide layer. A channel region around the source drain extends across a first doped well and a second doped well having different dopant concentration. The channel region further comprises two grading regions with different dopant concentrations around the drain region.

20 Claims, 5 Drawing Sheets

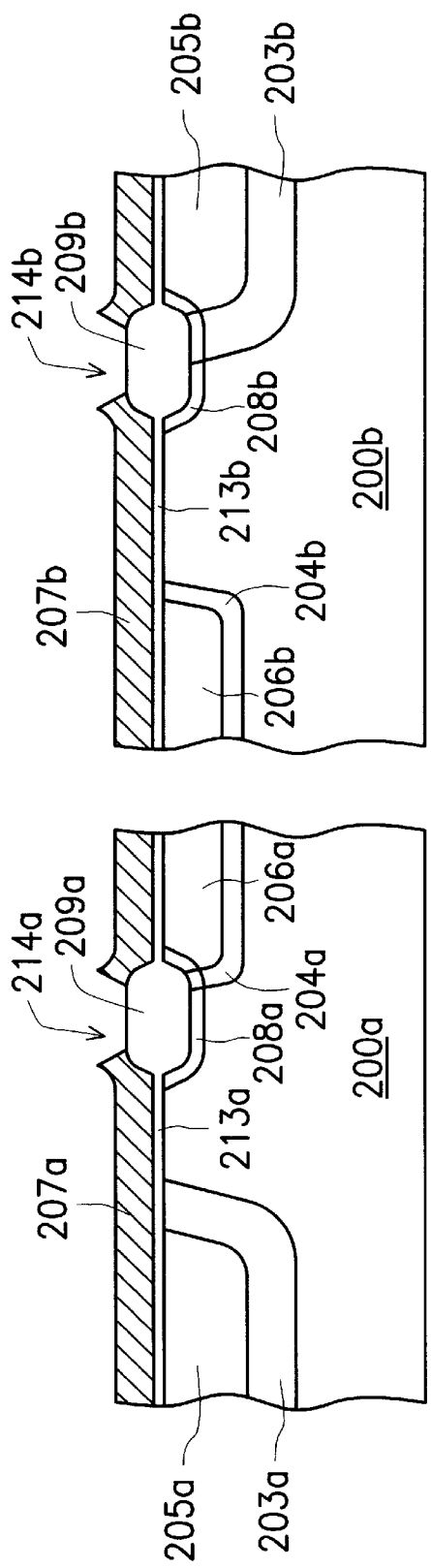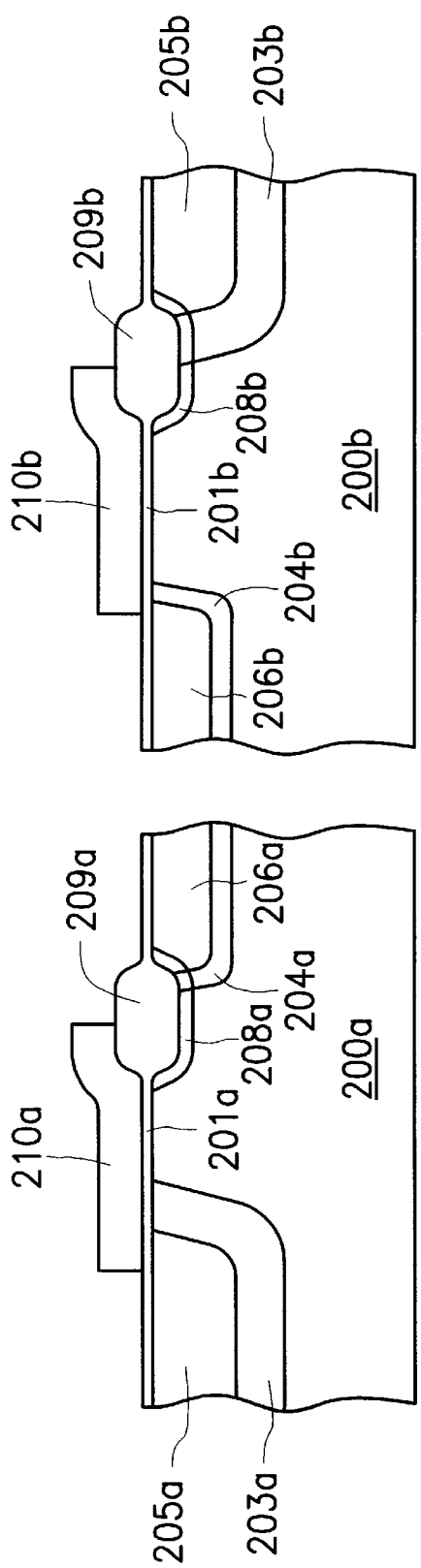

HIGH-VOLTAGE METAL-OXIDE SEMICONDUCTOR

BACKGROUND OF THE INVENTION

1. Field of Invention

The present invention relates to a semiconductor fabricating method. More particularly, the present invention relates to a method of forming a metal oxide semiconductor.

2. Description of Related Art

Due to the increasing number of semiconductor elements incorporated in integrated circuits, the size of metal oxide semiconductor (MOS) components is greatly reduced. Accordingly, as the channel length of the MOS is decreased, the operating speed is increased. However, there is an increased likelihood of a problem, referred to as "short channel effect", caused by the reduced channel length. If the voltage level is fixed, according to the equation of "electrical field=electrical voltage/channel length", as the channel length is shortened, the strength of electrical field is increased. Thus, as the intensity of electrical filed increases, electrical activity increases and electrical breakdown is likely to occur.

To solve the problem of electrical breakdown, a method to fabricate a high voltage device being able to withstand a high intensity of electric field has been developed. An isolation structure and a drift region, which is below the isolation structure, are formed on a substrate between a gate and a source/drain of a MOS to increase the distance between the source/drain region and the gate.

In the application of radio frequency (RF), a higher power gain is required to improve frequency response. The method to obtain a higher power gain is to increase the transconductance of the devices. While increasing the transconductance of devices, the intensity of electrical field of the junction between the source region and the channel region increases. In other words, as the electrical field of the channel region increases, the transconductance of the device is increased. In order to avoid the short channel effect and electrical breakdown, the electrical field of channel region must be limited. Thus, a high transconductance is difficult to obtain in the conventional fabrication method of a MOS.

FIG. 1 is a cross-sectional view showing a conventional fabrication process of forming a lateral double-diffused MOS (LDMOS).

In FIG. 1, a conventional LDMOS includes a P-type substrate 100, a field oxide layer 101, a gate oxide layer 102, a gate layer 103, an N+ drain region 104, an N− drift region 105, a N+ source region 106, and a P-doped region 107.

The dopant concentration in the N− drift region 105 is lightened in the conventional LDMOS in order to achieve a high voltage operation. However, this level of enhance voltage is limited, and consequently, the driving current is reduced. In the application of radio frequency, a higher transconductance is required, that is, the intensity of electrical field strength at the junction between the source region and the channel is increased, or the dopant concentration in the P-doped region of the source region is increased. In this manner, an electrical breakdown is easily caused. Hence, the increase of transconductance is not easy to achieve. Therefore, the application of conventional LDMOS is limited.

SUMMARY OF THE INVENTION

It is an object of the invention to provide a fabricating method of a high-voltage MOS device. The transconductance of the device is increased to withstand a high breakdown voltage with an enhanced current driving performance.

It is another object of the invention to provide a method of forming a high-voltage MOS device to form a channel region comprising a first part being heavily doped and a second part being lightly doped. The first part is applied with an electrical field with a high intensity to increase the transconductance, while the second part prevents electric breakdown.

It is yet another object of the invnetion to provide a method to fabricate a high voltage MOS device. Two portions with different doping concentration are formed aside the drain region of the MOS device. Apart from preventing electric breakdown as mentioned above, the performance of driving current is enhanced.

Accordingly, the present invention provides a fabricating method of a high-voltage metal oxide semiconductor. Two channel regions with different concentrations are formed in a channel region. Two grading regions with different concentrations are formed around the side wall of drain region. The channel region with high concentration can increase the internal electrical field. And thus, the transconductance of components is increased. The other channel region with low concentration can be used to avoid the electrical breakdown. Moreover, the two grading regions formed around the sidewall of the drain region not only avoid electrical breakdown but also increases the capability of current driving.

It is to be understood that both the foregoing general description and the following detailed description are exemplary and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings, FIGS. 2A through 2G are cross-sectional views of a portion of a semiconductor showing the steps of fabricating a high-voltage LDMOS according to one preferred embodiment of the invention.

DESCRIPTION OF THE PREFERRED EMBODIMENTS

Figure 1:
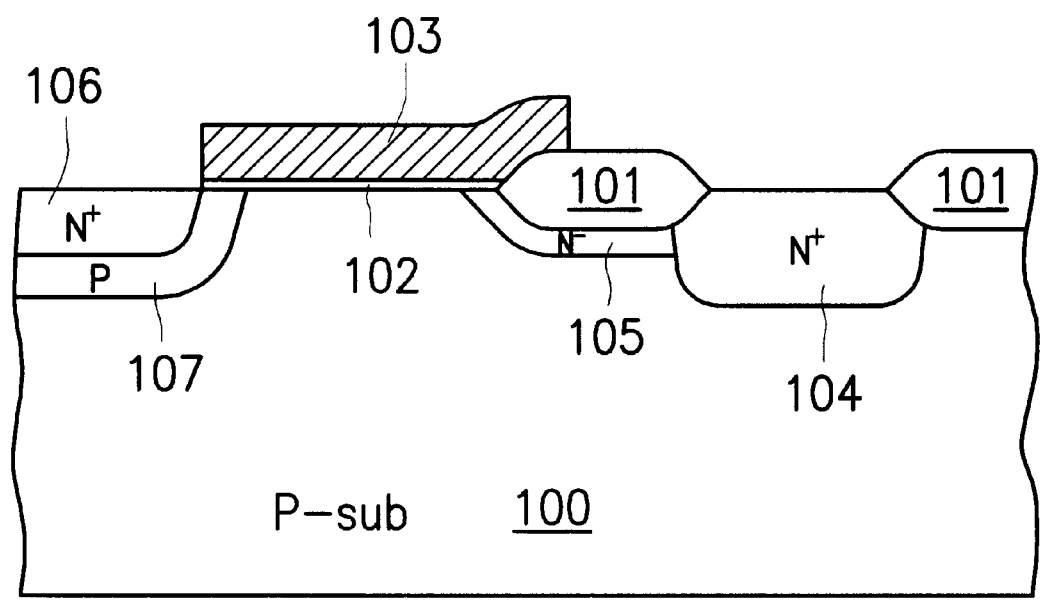
FIG. 1 is a cross-sectional view showing a structure of a conventional LDMOS.

Reference will now be made in detail to the present preferred embodiments of the invention, examples of which are illustrated in the accompanying drawings. Wherever possible, the same reference numbers are used in the drawings and the description to refer to the same or like parts.

The fabricating process of a high-voltage MOS is shown in the following FIGS. 2A through 2G according to one preferred embodiment of the invention. A P-type region 200a and an N-type region 200b are provided. The combination of the P-type region 200a and the N-type region 220b may be that P-type region 220a is included in the N-type region 220b, or on the contrary, the N-type region 220b is included in the P-type region 220a. Or alternatively, both the P-type and the N-type region 220a and 220b are formed as a twin well structure in a single substrate, or even a P-type epitaxy layer and an N-type epitaxy layer on an insulation substrate, respectively. In this embodiment, the P-type region 220a and the N-type region 220b are separately sketched as shown in the FIG. 2A to FIG. 2G in order to avoid the restriction of the application of this invention. The fabricating process may be applied to a MOS device, such as NMOS or a PNOS, and a complementary MOS (CMOS).

Figure 2A:
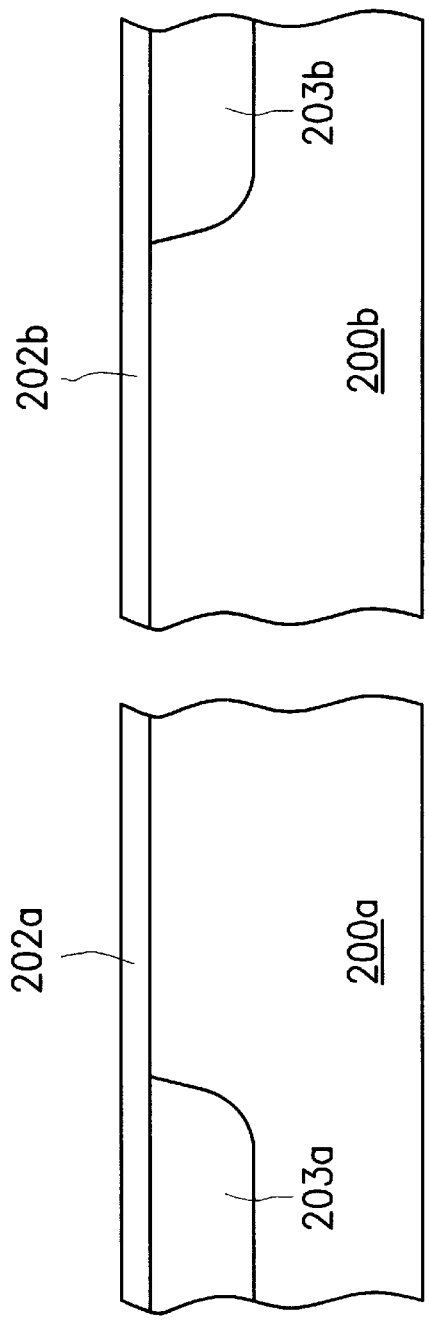

In FIG. 2A, an oxide layer 202a and 202b is formed to cover the P-type region 200a and the N-type region 200b, respectively. A P-type ion implantation is performed to form a P-well 203a in the P-type region 200a and a P-well 203b in the N-type region 200b.

Figure 2B:
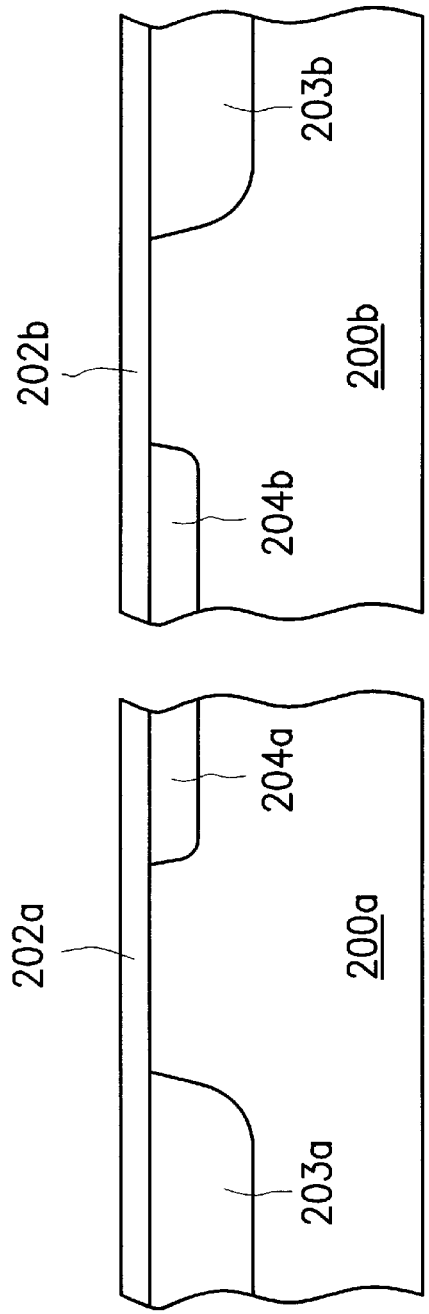

In FIG. 2B, an N-type ion implantation is performed to form an N-well 204a in the P-type region 200a and an N-well in the N-type region 200b. An ion drive-in step is performed.

Figure 2C:
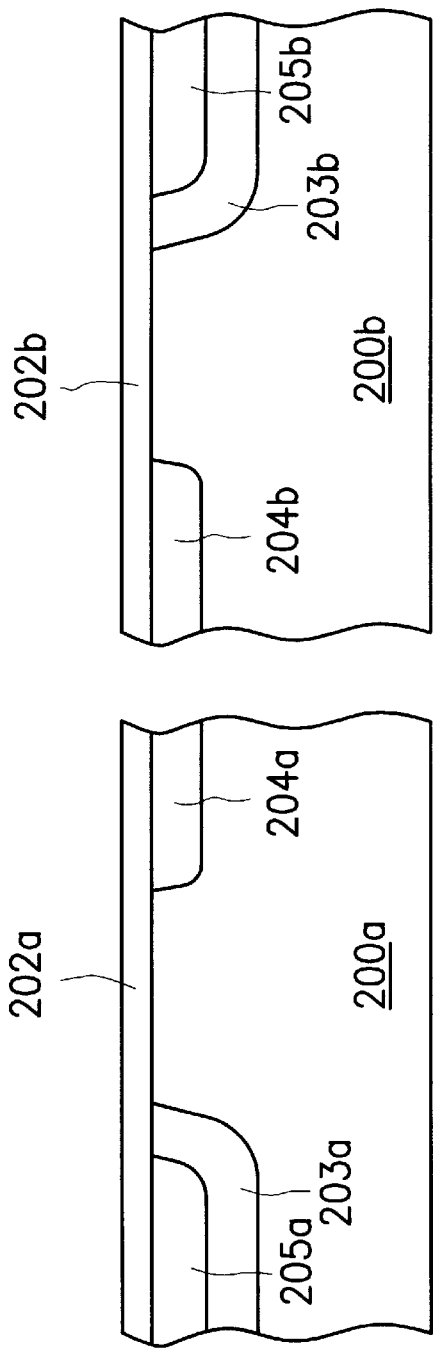

In FIG. 2C, a second P-type ion implantation is performed to form a P-well 205a in the P-well 203a and a P-well 205b in the P-well 203b.

Figure 2D:
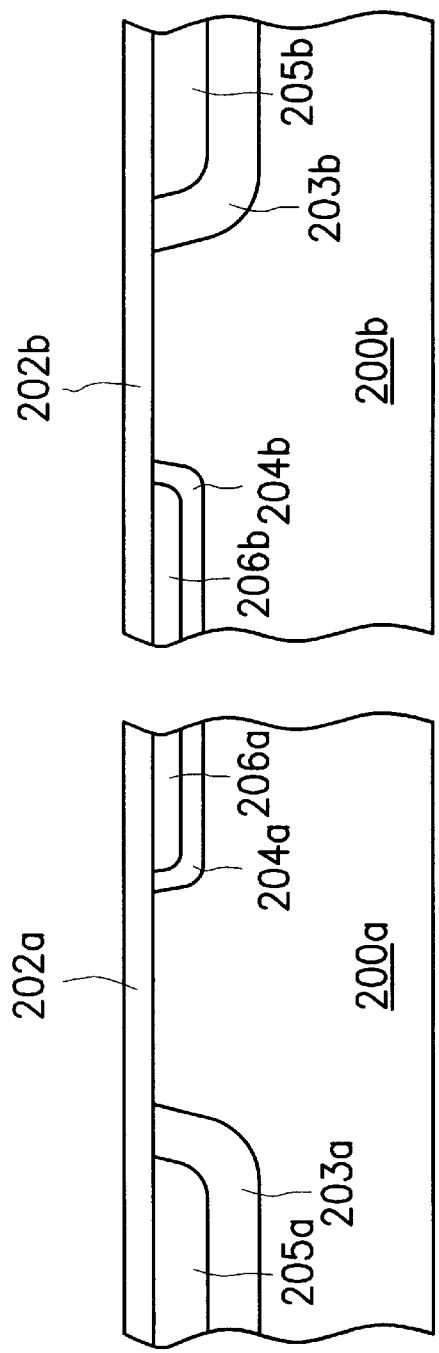

In FIG. 2D, another N-type ion implantation is performed to form a N-well 206a in the N-well 204a and a P-well 206b in the P-well 204b.

In FIG. 2E, the oxide layer 202a and 202b is removed. A pad oxide layer 213a and 213b is formed on the P-type regions 200a and 200b. A nitride silicon layer 207a and 207b is formed on the pad oxide layer 213a and 213b. Openings 214a and 214b are formed in the nitride silicon layer 207a and 207b to expose parts of the P-type region 200a and N-type region 200b. The exposed part of the P-type region 220a includes an area across the N-well 204a, the N-well 206a and a part of the bulk surface of the P-region 200a. The exposed part of the N-type region 220b includes an area across the P-well 203b, the P-well 205b, and a part of the bulk surface of the N-type region 200b. An N⁻ ion implantation is performed to form an N⁻ drift region 208a in the substrate 200a. A P⁻ ion implantation is performed to form a P⁻ drift region 208b in the substrate 200b. A thermal oxidation step is performed to form a filed oxide layer 209a on the N⁻ drift region 208a and a filed oxide layer 209b on a P⁻ drift region 208b.

In FIG. 2F. the silicon nitride layer 207a and 207b and the pad oxide layer 213a and 213b are removed. A gate oxide layer 201a and 201b is formed on the substrate 200a and 200b. A polysilicon layer (not shown) is formed over the substrate 200a and 200b. The polysilicon layer is patterned to form a gate layer 210a and 210b on the gate oxide layer. The gate layer 210a covers the gate oxide layer 201a over a part of the P-wells 203a and 205a, and a part of the field oxide layer 209a. Whereas, the gate layer 210b covers a part of the N-wells 204b and 206b and the field oxide layer 209b. The polysilicon layer is for example, a doped polysilicon layer.

Figure 2G:
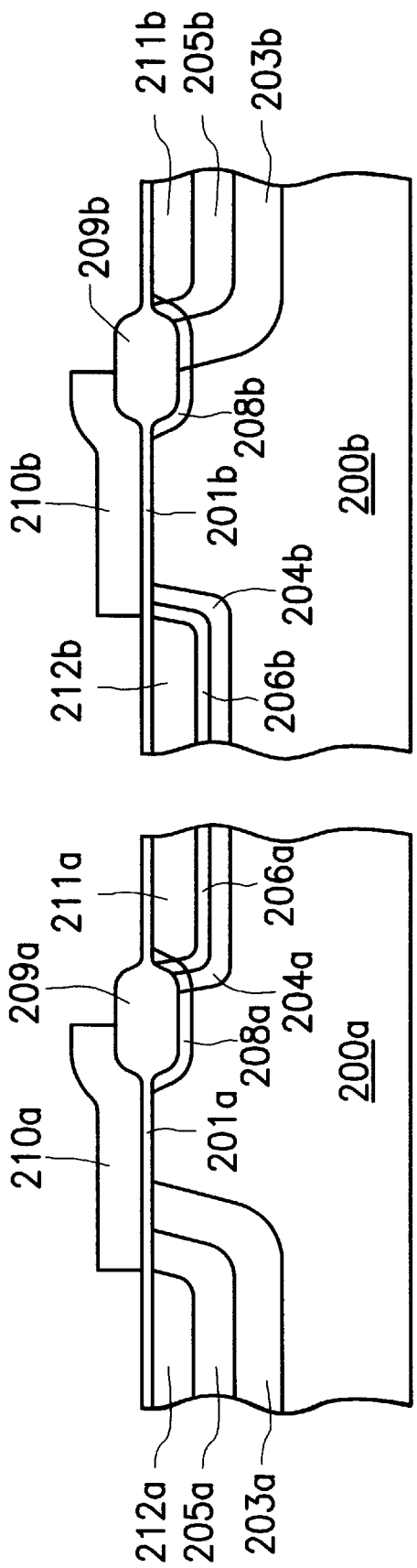

In FIG. 2G, a N⁺ source/drain ion implantation is performed to form an N⁺ drain region 211a in the N-well 206a and an N⁺ source region 212a in the P-well 205a. A P⁺ source/drain ion implantation is performed to form a P⁺ drain region 211b in the P-well 205b and a P⁺ source region 212b in the N-well 206b. An annealing step is performed, and a LDMOS device is formed.

As shown in FIG. 2G, the high-voltage LDNMOS structure is formed on a substrate 200a. A gate oxide layer 201a is formed on the P-type region 200a. The LDNMOS comprises a gate layer 210a on the gate oxide layer 201 a, a N⁺ drain region 211a and an N⁺ source region 212a. A field oxide layer 209a is formed between the gate layer 210a and the N⁺ drain region 211a. A P⁻ drift region 208a is formed under the field oxide layer 209a. The N source region 212a is encompassed by the P-well 205a, while the P-well 205a is encompassed by the P-well 203a. Similarly, the N⁺ drain region 211a is encompassed by the N-well 206a, while the N-well 206a is encompassed by the N-well 204a.

The dopant concentration is in the order of: "the N⁺ drain region 211a>the N-well 206a>the N-well 204a", and "the P⁻well 205a>the P-well 203a>the P-type region 200a".

In constrast, the high-voltage LDPMOS structure is formed on an N-type region 200b. A gate oxide layer 201b is formed on the N-type region 200b. The LDPMOS comprises a gate layer 210b formed on the gate oxide layer 201b, a P⁺ drain region 211b and a P⁺ source region 212b. A field oxide layer 209b is formed between the gate layer 210b and the P⁺ drain region 211b. An N⁻ drift region 208b is formed under the field oxide layer 209b. The P⁺ source region 212b is encompassed by the N-well 206b, while the P-well 206b is encompassed by the P-well 204b. Similarly, the P⁺ drain region 211b is encompassed by the P-well 205b, while the P-well 205b is encompassed by the N-well 204a.

The dopant concentration is in the order of: "the P⁺ drain region 211b>the P-well 205b>the P-well 203a", and "the N⁻well 206b>the P-well 204a>the N-type region 200b".

In the LDNMOS, the channel region under the gate layer 210a around the N⁺ source region 212a includes regions across the P-well 205a and the P-well 203a. Around the N⁺ drain region 211a, the channel region further comprises two grading regions, that is, portions of the first N-well 204a and the N-well 206a. In contrast, in the LDPMOS, the channel region under the gate layer 210b around the P⁺ source region includes regions across the second N-well 204b and the fourth N-well 206b. Around the P⁻ source region 211b. the channel region further comprises two grading regions formed of portions of the second P-well 203b and the fourth P-well 205b.

As the region of the third P-well region 205a has a dopant concentration higher than that of the region of the portion of the first P-well region 203 a, the internal electric field is enhanced to obtain a high transconductance. On the other hand, with the formation of the first P-well region 203a, the N⁺ source region 212a can thus withstand a high voltage of electric breakdown. The formation of the grading regions may as well increase the breakdown voltage of the N⁺ drain region 211a, in addition, the driving current performance may also be enhanced. It is apparent that the LDPMOS has a similar structure to the LDNMOS, so that similar effects and advantages may be achieved as the LDNMOS.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A high-voltage metal oxide semiconductor device, comprising:

a P-type region;

a gate on the P-type region;

an N-type source region and an N-type drain region in the P-type region, aside of the gate;

a field oxide layer, under a part of the gate to isolate the gate and the N-drain region;

an N-type drift region, under the field oxide layer;

a first P-well, encompassing the N-type source region in the P-type region;

a second P-well, encompassing the first P-well in the P-type region;

a first N-well, encompassing the N-type drain region in the P-type region; and a second N-well, encompassing the first N-well in the P-type region; wherein the first P-well has a dopant concentration higher than that of the second P-well.

2. The device of claim 1, wherein the P-type region comprises a P-type well in a substrate.

3. The device of claim 1, wherein the P-type region comprises a P-type substrate.

4. The device of claim 1, wherein the dopant concentration of the second P-well is higher than the dopant concentration of the P-type region.

5. The device of claim 1, wherein the N-type drain region has a dopant concentration higher than that of the first N-well.

6. The device of claim 1, wherein the dopant concentration of the first N-well is higher than that of the second N-well.

7. A high-voltage metal oxide semiconductor device, comprising:

an N-type region;

a gate on the N-type region;

a P-type source region and a P-type drain region in the N-type region, aside of the gate;

a field oxide layer, under a part of the gate to isolate the gate and the P-type drain region;

an P-type drift region, under the field oxide layer;

a first N-well, encompassing the P-type source region in the N-type region;

a second N-well, encompassing the first N-well in the N-type region;

a first P-well, encompassing the P-type drain region in the N-type region; and a second P-well, encompassing the first P-well in the N-type region; wherein the first N-well has a dopant concentration higher than that of the second N-well.

8. The device of claim 7, wherein the N-type region comprises a N-type well in a substrate.

9. The device of claim 7, wherein the N-type region comprises a N-type substrate.

10. The device of claim 7, wherein the concentration of the second N-well is higher than the dopant concentration of the N-type region.

11. The device of claim 7, wherein the P-type drain region has a dopant concentration higher than the dopant concentration of the first P-well.

12. The device of claim 7, wherein the dopant concentration of the first P-well is higher than that of the second P-well.

13. A high-voltage metal oxide semiconductor device, comprising:

a P-type region and an N-type region;

a first gate on the P-type region, and a second gate on the N-type region;

an N-type source region and an N-type drain region in the P-type region, aside of the first gate, and a P-type source region and a P-type drain region on the N-type region, aside the second gate;

a first field oxide layer, under a part of the first gate to isolate the gate and the N-drain region, and a second field oxide layer, under a part of the second gate to isolate the second gate and the P-drain region;

a first and second N-type drift region, under the first and the second field oxide layers, respectively;

a first P-well, encompassing the N-type source region in the P-type region, and a first N-well, encompassing the P-type source region in the N-type region;

a second P-well, encompassing the first P-well in the P-type region, and a second N-well, encompassing the first N-well in the N-type region;

a third N-well, encompassing the N-type drain region in the P-type region, and a third P-well, encompassing the P-type drain region in the N-type region; and a fourth N-well, encompassing the first N-well in the P-type region, and a fourth N-well, encompassing the first N-well in the P-type region; wherein the first P-well has a dopant concentration higher than that of the second P-well; and the first N-well has a dopant concentration higher than that of the second N-well.

14. The device of claim 13, wherein the P-type region comprises a P-type substrate including the N-type region.

15. The device of claim 13, wherein the N-type region comprises an N-type substrate including the P-type region.

16. The device of claim 13, wherein the N-type region and the P-type region comprise an N-well and a P-well formed on a substrate, respectively.

17. The device of claim 13, wherein the N-type region and the P-type comprises an N-type epitaxy and a P-type epitaxy formed on a substrate, respectively.

18. The device of claim 13, wherein the dopant concentration of the second P-well is higher than that of the P-type region, and the dopant concentration of the second N-well is higher than that of the N-type region.

19. The device of claim 13, wherein the third N-well has a dopant concentration higher than that of the fourth N-well, and less than that of the N-type drain region.

20. The device of claim 13, wherein the third P-well has a dopant concentration higher than that of the fourth P-well, and less than that of the P-type drain region.

* * * * *